United States Patent
Ben-Zvi et al.

(10) Patent No.: US 8,421,026 B2
(45) Date of Patent: Apr. 16, 2013

(54) METHOD AND APPARATUS FOR MAPPING OF LINE-WIDTH SIZE DISTRIBUTIONS ON PHOTOMASKS

(75) Inventors: Guy Ben-Zvi, Shechania (IL); Vladimir Dmitriev, Kanniel (IL); Eitan Zait, Kiriat-Tivou (IL); Erez Graitzer, Gilon (IL)

(73) Assignee: Carl Zeiss SMS Ltd., Karmiel (IL)

(*) Notice: Subject to any disclaimer, the term of this patent is extended or adjusted under 35 U.S.C. 154(b) by 54 days.

(21) Appl. No.: 12/811,591

(22) PCT Filed: Jan. 2, 2009

(86) PCT No.: PCT/EP2009/050004
§ 371 (c)(1),
(2), (4) Date: Feb. 8, 2011

(87) PCT Pub. No.: WO2009/083606
PCT Pub. Date: Jul. 9, 2009

(65) Prior Publication Data
US 2011/0122395 A1    May 26, 2011

Related U.S. Application Data

(60) Provisional application No. 61/018,682, filed on Jan. 3, 2008.

(51) Int. Cl.
G01J 1/00    (2006.01)
(52) U.S. Cl.
USPC ............................................. 250/372
(58) Field of Classification Search .............. 250/372
See application file for complete search history.

(56) References Cited

U.S. PATENT DOCUMENTS

| | | | | |
|---|---|---|---|---|
| 6,614,520 B1* | 9/2003 | Bareket et al. | | 356/237.3 |
| 6,664,121 B2* | 12/2003 | Grodnensky et al. | | 438/16 |
| 2004/0207836 A1* | 10/2004 | Chhibber et al. | | 356/237.4 |
| 2004/0223145 A1* | 11/2004 | Butt et al. | | 356/237.5 |
| 2005/0254063 A1* | 11/2005 | Hill | | 356/512 |
| 2006/0192936 A1* | 8/2006 | Schenau et al. | | 355/69 |
| 2007/0019187 A1* | 1/2007 | Schuster et al. | | 356/237.6 |
| 2007/0065732 A1* | 3/2007 | Lee et al. | | 430/5 |

FOREIGN PATENT DOCUMENTS

EP    1 696 271    8/2006
WO    WO 2005008333 A2 *    1/2005

OTHER PUBLICATIONS

Ben-Zvi et al., "Very High Sensitivity Mask DUV Transmittance Mapping and Measurements Based on Non Imaging Optics", Proceedings of SPIE—The International Society for Optical engineering—EMLC 2008—24th European Mask and Lithography Conference 2008 SPIE US, vol. 6792, Jan. 21, 2008, XP002523397.
Labovitz et al., "Detection of Progressive Transmission Loss Due to Haze With Galileo™ Mask DUV Transmittance Mapping Based on Non Imaging Optics", Proceedings of SPIE—The International Society for Optical Engineering—Photomask Technology 2008 SPIE US, vol. 7122, Oct. 7, 2008, XP002523398.
Ben-Zvi, Guy et al., "Mask CD Control (CDC) with Ultrafast Laser for Improving Mask CDU Using AIMS™ as the CD Metrology Data Source", *Proceedings of the SPIE—Photomask Technology*, vol. 6730, pp. 67304X-1-67304X-9 (2007).
Koen van Ingen Schenau et al., "Scatterometry based 65nm node CDU analysis and prediction using novel reticle measurement technique", *Proceedings of SPIE—Metrology, Inspection, and Process Control for Microlithography XIX*, vol. 5752, pp. 1312-1322 (2005).
International Search Report for International Application No. PCT/EP2009/050004 dated Apr. 15, 2009.

* cited by examiner

*Primary Examiner* — Marcus Taningco
(74) *Attorney, Agent, or Firm* — Fish & Richardson P.C.

(57) ABSTRACT

In general, in one aspect, a method includes determining a critical dimension (CD) distribution on a photomask by measuring deep Ultra-Violet (DUV) transmission across the photomask.

36 Claims, 6 Drawing Sheets

METHOD AND APPARATUS FOR MAPPING OF LINE-WIDTH SIZE DISTRIBUTIONS ON PHOTOMASKS

This application is the National Stage of International Application No. PCT/EP2009/050004, filed Jan. 2, 2009, which claims priority to U.S. Provisional Patent Application Ser. No. 61/018,682, filed on Jan. 3, 2008. The contents of these applications are herein incorporated by reference in their entirety.

CROSS-REFERENCE TO RELATED APPLICATIONS

This application claims priority to U.S. Provisional Patent Application Ser. No. 61/018,682 filed Jan. 3, 2008 entitled "METHOD AND APPARATUS FOR MAPPING OF LINE-WIDTH SIZE DISTRIBUTIONS ON PHOTOMASKS" by Guy BEN-ZVI et al., the contents of which are incorporated herein by reference.

FIELD OF THE INVENTION

The present invention relates to photolithography in the semiconductor industry. More particularly it relates to a method and apparatus for determining the line-width size distribution of lines which are patterned on photomasks, by measurement of DUV (Deep-Ultra-Violet) light transmission distribution across the mask.

BACKGROUND OF THE INVENTION

Photo-masks (also referred to as reticles) used in the manufacturing of integrated circuits are exposed during the manufacturing process to DUV (Deep Ultra-Violet) radiation and transfer the image patterned on the photo-mask, to the photo-sensitive material coated on a substrate (e.g., a Silicon wafer).

An image is typically transferred at a reduction ratio of 1:4, in which case all pattern dimensions are de-magnified 4 times on wafer level in order to obtain the desired dimensions on the final product (the wafer). Other reduction ratios can be used.

Line width size distribution across the photomask may be determined by CD (Critical Dimension) measurements, which measure CD directly by metrology tools or inspection tools, at typical accuracies of about 1 nm (nanometer) on wafer level.

It is well known in the semiconductors industry that a 1 nm variation in CD of transistors critical layers of front-end integrated circuit (IC), can result in up-to 100 MHz loss of processing speeds of the final product. Therefore, mapping of CD variations across the mask is an indispensable necessity for wafers yield analysis and performance of the final made IC.

At typical front end IC (integrated circuits) manufacturing processes with design rules of dense lines and spaces with CD of 45-90 nm a 1% transmission difference on photomask level, translates to more than 1 nm of CD variation on wafer level.

Inspection tools based on optical image processing are not able to detect accuracy values smaller than 1% of transmission differences, due to the small dynamic range of detection devices, such as CCD cameras (typically 8-10 bits), and the small field of view, which cannot ensure proper statistical averaging to be above noise level.

Therefore, accuracy of CD measurements is typically in the order of 1 nm.

Semi-direct measurements of CD are also carried out by optical metrology tools. Such tools for measuring CD distributions on photomasks are based upon scatterometry techniques, which analyze scattered light signals at variable angles or wavelengths, at two orthogonal polarizations.

Such techniques use simulation algorithms to convert measured results into CD data distributions. However, scatterometry requires predefined geometrical features on photomasks, which can be patterned only on scribe-lines, outside of the IC real active area. Measurement accuracy is also limited to about 1 nm on.

Additional methods available today to IC wafer fabs and photomask-shops include using a scanning electron microscope (SEM) and an atomic-force microscope (AFM). However, SEM method is also known to have accuracy levels of about 1 nm, and it is a destructive method (needs to measure in scribe-lines to avoid real pattern damage by electron-beam). Moreover, SEM is a slow process that limits the number of measurement points severely. Also, this technique requires the removal of the pellicle, which necessitates re-cleaning and re-pelliclizing and that actually makes the inspection itself redundant.

AFM method, though accurate enough, is so slow by nature (tens of minutes per point), so it can only be used for test and calibration, but not for mapping CD distributions.

SUMMARY

The present disclosure describes a system for fast non-imaging optical CD distribution mapping of a full size photomask by DUV. By measuring the transmission distribution across the photomask it is possible to indirectly determine the CD distribution across the photomask.

We now generally summarize different aspects and features of the systems and methods disclosed herein.

In some aspects, a method includes determining a critical dimension (CD) distribution on a photomask by measuring deep Ultra-Violet (DUV) transmission across the photomask.

Embodiments can include one or more of the following.

Measuring the DUV transmission can include performing transmission measurements at a plurality of locations on a photomask using a non-imaging tool to generate transmission information.

The non-imaging tool can be a tool in which a one to one correspondence between an object and an image does not exist. The non-imaging tool can be a tool configured such that points of a source collected at a target plane are not distinguishable. The non-imaging tool can be a tool configured such that an image is not formed at a detector.

The critical dimension distribution can be a critical dimension variation map. The critical dimension distribution can be a synthetic variation map. The critical dimension distribution can provide information about line-width size distribution of lines patterned on a photomask. The critical dimension distribution can be a critical dimension distribution on a photomask. The critical dimension distribution can be a critical dimension distribution at the mask level. The critical dimension distribution can be a critical dimension distribution at the wafer level. The critical dimension distribution can be a critical dimension distribution of photomask critical dimension variations.

Measuring the DUV transmission can include focusing a radiation beam on a front side of the photomask. Focusing the radiation beam on the front side of the photomask comprises by irradiating the photomask through a back side of the photomask. Measuring the DUV transmission can include measuring the DUV transmission without removing a pellicle from a front side of the photomask. Measuring the DUV transmission can include measuring the DUV transmission with a pellicle on a front side of the photomask.

The method can also include generating a transmission map based on the measured DUV transmission. Determining the CD distribution can include generating a CD distribution map based on the transmission map. The method can also include generating a CD distribution map of at least a portion of the photomask based on the determined CD distribution.

Determining the CD distribution can include applying a correction factor, the correction factor being based on a predetermined linear ratio between CD variations and transmission variations. Determining a CD distribution can include determining transmission variations based on the measured DUV transmission and transforming the transmission variations into a CD distribution map according to a ratio. The ratio can be a linear ratio. The linear ratio can be predetermined according to a ratio between CD variations and transmission variations. The method can also include prior to performing transmission measurements, determining the ratio by calculating a ratio between CD variations and transmission variations.

The CD distribution can include information indicative of line-width size distribution of lines patterned on the photomask.

A measurement time for each of the transmission measurements can be less than one second. Measuring the DUV transmission can include performing a transmission measurement taking a fraction of a second.

Measuring the DUV transmission across the photomask can include measuring the DUV transmission at a plurality of locations on a photomask associated with an active area of a device.

A pattern on the photomask can be a non-periodic pattern. The method can also include calculating expected transmission values for a plurality of measurement positions on the photomask based on the non-periodic pattern on the photomask. The method can also include calculating a correction factor for each of the plurality of measurement positions on the photomask based on the expected transmission values. Calculating information indicative of CD uniformity can include calculating information indicative of CD uniformity based on the transmission measurement and the calculated correction factor.

In some embodiments, the photomask can include at least some locations patterned with a periodic structure. Performing the transmission measurements can include performing the transmission measurements at locations patterned with the periodic structure.

In some embodiments, a pattern on the photomask can be a fully periodic structure.

Measuring the DUV transmission can include measuring the transmission using a non-imaging tool that includes a DUV light source and a detection device.

The non-imaging tool can be a wideband deep-UV optical measurement system.

Measuring the DUV transmission can include performing multiple transmission measurements at each of a plurality of locations on the photomask and averaging the multiple measurements at each of the plurality of locations to generate the transmission information. Averaging the multiple measurements can generate transmission information having an accuracy level of less than about 0.1% transmission level.

The DUV light source can be a light source having a bandwidth of from about 170 nm to about 290 nm. The DUV light source can be a light source having a bandwidth of from about 193 nm to about 248 nm. The DUV light source is configured to generate a spot size of from about 0.2 mm to about 5.5 mm in diameter. The DUV light source can be a wide-band illumination source. The wide-band illumination source can be an ultra-quiet wideband illumination source. The wide-band illumination source can be a Mercury-Xenon source. The wide-band illumination source can be a Deuterium discharge lamp. The wide-band illumination source can be a Xenon source.

The detection device can be a fast photodiode. The detection device can be a phototube. The detection device can be a photomultiplier tube.

The method can also include, prior to performing the transmission measurements and determining the CD distribution, performing a correction process to modify the critical dimension of one or more features on the photomask. The correction process can include applying shading elements. Applying shading elements can include applying shading elements inside the photomask. The method can also include determining an effectiveness of the correction process based on the determined CD distribution.

The photomask can be a binary photomask. The photomask can be a chrome plated photomask. The photomask can be a MoSi coated photomask. The photomask can be an alternating phase-shift photomask.

Determining the critical dimension distribution further can include measuring, using a non-imaging optical system, a transmission distribution across a photomask and indirectly determining the critical dimension distribution across the photomask based on the measured transmission distribution.

In some aspects, a system includes a detection device configured to measure deep-UV (DUV) transmission across the photomask and a computing system configured to determine a critical dimension distribution based on the measured DUV transmission across the photomask.

Embodiments can include one or more of the following.

The system can be a non-imaging system. The non-imaging system can be a system in which a one to one correspondence between an object and an image does not exist. The non-imaging system can be a system configured such that points of a source collected at a target plane are not distinguishable. The non-imaging system can be a system configured such that an image is not formed at the detection device. The non-imaging system can be a wideband DUV optical measurement system.

The system can also include an illumination source configured to generate a DUV radiation beam and direct the deep-UV radiation beam onto the photomask. The illumination source can be a source having a bandwidth of from about 170 nm to about 290 nm. The illumination source can be a source having a bandwidth of from about 193 nm to about 248 nm. The illumination source can be configured to generate a spot size of from about 0.2 mm to about 5.5 mm in diameter. The illumination source can be a wide-band illumination source. The wide-band illumination source can be an ultra-quiet wideband illumination source. The wide-band illumination source can be a Mercury-Xenon source. The wideband illumination source can be a Deuterium discharge lamp. The wide-band illumination source can be a Xenon source.

The detection device can be configured to detect radiation transmitted through the photomask. The detection device can be a fast photodiode. The detection device can be a phototube. The detection device can be a photomultiplier tube.

The system can also include a wideband light source. The wideband light source can be configured to generate a DUV beam.

The system can also include a condenser lens. The condenser lens can be configured to focus the DUV beam onto the photomask. The condenser lens can be configured to focus the DUV beam to a small spot size on a front side of the photomask.

The system can also include a movable XY stage.

The detection device can be a DUV detector.

The system can also include a collecting lens configured to project a DUV illuminated spot onto the DUV detector. The collecting lens can be configured to focus a radiation beam on a front side of the photomask by irradiating a photomask through a back side of the photomask.

The system can also include an imaging system configured to align the photomask. The imaging system can include an objective lens, a tube-lens, and a CCD camera. The system can also include a computer system configured to receive images from the CCD camera and determine coordinates on the photomask.

The system can also include a stage control device configured to register the stage based on the determined coordinates.

The critical dimension distribution can be a critical dimension variation map. The critical dimension distribution can be a synthetic variation map. The critical dimension distribution can provide information about line-width size distribution of lines patterned on a photomask. The critical dimension distribution can be a critical dimension distribution on a photomask. The critical dimension distribution can be a critical dimension distribution at the mask level. The critical dimension distribution can be a critical dimension distribution at the wafer level. The critical dimension distribution can be a critical dimension distribution of photomask critical dimension variations.

The system can be configured to measure the DUV transmission without removing a pellicle from a front side of the photomask. The system can be configured to measure the DUV transmission with a pellicle on a front side of the photomask.

The computing system can be configured to generate a transmission map based on the measured DUV transmission. The computing system can be further configured to generate a CD distribution map based on the transmission map. The computing system can be configured to generate a CD distribution map of at least a portion of the photomask based on the determined CD distribution.

The computing system can be configured to apply a correction factor, the correction factor being based on a predetermined linear ratio between CD variations and transmission variations.

The computing system can be configured to determine transmission variations based on the measured DUV transmission measurements and transform the transmission variations into a CD distribution map according to a ratio. The ratio can be a linear ratio. The computing system can be configured to determine the linear ratio according to a ratio between CD variations and transmission variations.

The CD distribution can include information indicative of line-width size distribution of lines patterned on the photomask. The system can be configured to provide a measurement time for each of the transmission measurements of less than one second.

The detection device can be configured to measure the DUV transmission at a plurality of locations on the photomask associated with an active area of a device. A pattern on the photomask can be a non-periodic pattern. The computing system can be configured to calculate expected transmission values for a plurality of measurement positions on the photomask based on the non-periodic pattern on the photomask. The computing system can be configured to calculate a correction factor for each of the plurality of measurement positions on the photomask based on the expected transmission values. The computing system can be configured to calculate information indicative of CD uniformity based on the transmission measurement and the calculated correction factor.

The photomask can include at least some locations patterned with a periodic structure and wherein the system is configured to perform the transmission measurements at locations patterned with the periodic structure.

A pattern on the photomask can be a fully periodic structure.

The system can be configured to perform multiple transmission measurements at each of a plurality of locations on the photomask and the computing system can be further configured to average the multiple measurements at each of the plurality of locations to generate the transmission information.

The system can be configured to provide an accuracy level of less than about 0.1% transmission level. The photomask can be a binary photomask. The photomask can be a chrome plated photomask. The photomask can be a MoSi coated photomask. The photomask can be an alternating phase-shift photomask.

DESCRIPTION OF PREFERRED EMBODIMENTS

The present invention provides a method for determining critical dimensions (CD) distribution on a photomask, by measuring DUV transmission across the photomask. The method can be performed by a system for fast non-imaging optical CD distribution mapping of a photomask by DUV by measuring the transmission distribution across the photomask and indirectly determining the CD distribution across the photomask based on the measured transmission distribution.

The method of the present invention can determine the CD map for all types of patterned photomasks, for example, chrome coated (Binary photomasks), MoSi coated, or alternating phase-shift photomasks (PSM), where Quartz is alternately etched between Chrome lines.

The method of the present invention employs a wide-band DUV optical measurement system directed from the back or front side of the photomask, through it, and focused onto or just short of the pattern layer.

The present invention employs DUV radiation beam from an ultra-quiet wide-band illumination source, such as Xe (Xenon), HgXe (Mercury-Xenon) or Deuterium (D2) discharge lamp, irradiating through the back side of the reticle through the glass (the IC industry traditionally refers to the substrate material as "glass" or "quartz" although it is typically made of fused silica), focused on the front surface of the reticle via a relay optical system, with spot size of typical size of 0.2-5.5 mm diameter. Measurement bandwidth is typically within the range of 170 nm up to 290 nm, which covers the two most widely used exposure wavelengths in advanced lithography of 193 nm and 248 nm (Excimer lasers of ArF and KrF sources).

Detection of the DUV radiation can be performed by a single device, such as fast photodiode or a photomultiplier tube (PMT) or a phototube.

The detection device has preferably a wide dynamic range of more then 5 orders of magnitude, and therefore is responsive under high levels of signal to noise ratio (SNR) conditions.

Since one measurement takes a fraction of a second, averaging of several measurements can increase SNR further, to accuracy levels of 0.1% transmission level and better, on the expense of measurement time. As such, in comparison to other methods for determining CD distributions, such as AFM and SEM described above, determination of CD distributions by measurement of DUV transmission provides a fast and non-destructive method for determining the CD distribution.

This high level of accuracy is made possible since the available irradiance of the system is over 500 μ-wattes/cm2, and noise equivalent power (NEP), which is mostly dark-current, is less then 1 nano-Watt/cm2.

Figure 5:
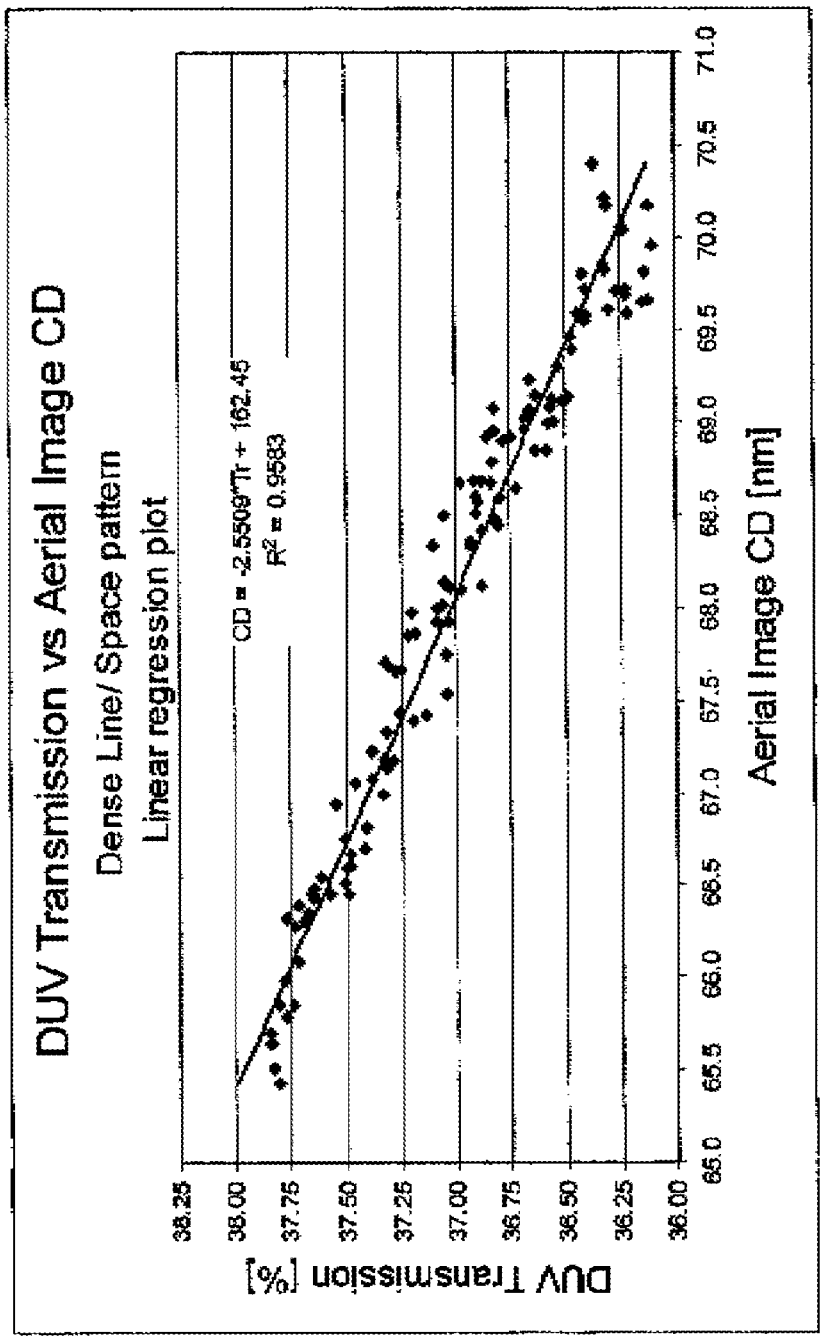
FIG. 5 illustrates a typical linear regression plot of Delta CD versus controlled transmission descending values, on real patterned photomask, with periodic identical features of dense lines and spaces.

High accuracy of transmission variation measurements is transformed into a CD distribution map according to a linear ratio which is separately found to exist between CD variations and transmission variations (see FIG. 5). This ratio can be determined prior to performing the transmission measurements.

Full size reticle measurement is accomplished preferably by a step and repeat or raster scan by a moving X,Y stage. Coordinates of all measurement points are fed into a central computer unit which generates a full size map of transmission values.

If the pattern on the photomask is fully periodic and repeatable as in memory type IC, then transmission variations are easily transformed into a CD variations map, according to the ratio determined separately (see FIG. 5).

For logic type IC, there are many identical patterns of periodic structures which are known to the IC manufacturer with exact coordinates and area size, so recipes (by the term "recipe" is meant a set of parameters associated with the specific production process) with the known measurement points are prepared and loaded to the central PC (processing unit).

For none periodic structures, the user has the option to use the photomask pattern loading, out of a data base, which, can project expected transmission values according to the printed pattern loading. Once a calibration factor is inserted, the user needs only a few chosen points for calibration at different pattern loads, and by applying a correction factor for each none-periodic measurement position, a synthetic variation map can be generated.

Measurement and mapping data is stored in PC memory, and a map of differences of transmission values is generated, in order to facilitate detection of fractions of percent of variations (Delta T).

Long term drifts of the detection system are removed by a normalizing process of measurement in air instead of through the reticle itself, periodically (at predefined time intervals).

The inventors of the present invention have conducted some tests in an attempt to determine the accuracy of such a measurement, and results of less then 0.2% of accuracy were achieved. Less then 0.1% of accuracy was achieved at longer measurement times, which are still at sub second level for each measurement. All measurements and mapping processes are done without having to remove the pellicle from the front side of the reticle.

Figure 1:
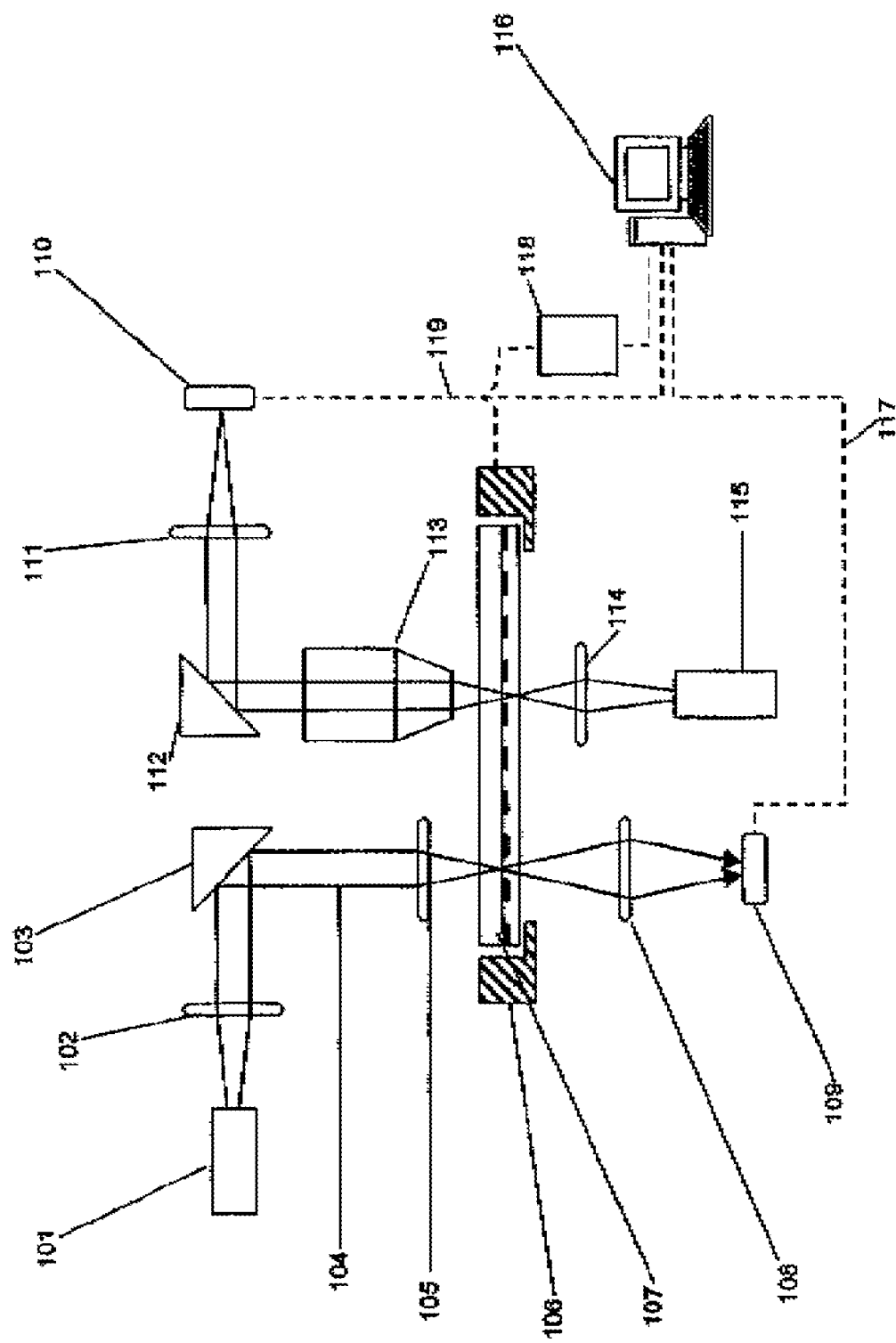
FIG. 1 illustrates the optical path and design of a measurement and mapping system.

FIG. 1 illustrates the optical path and design of a measurement and mapping system.

A DUV beam 104 originating from a wide-band light source 101 is collimated by a condenser lens 102. A second condenser lens 105 is focusing the DUV beam to a small spot size on reticle 107 front side. Reticle is installed on a moving XY stage 106.

DUV illuminated spot is projected by a collecting lens 108 onto a fast DUV detector 109. Signal 117 from the DUV detector is transferred to a central PC 116 for data acquisition and mapping.

Alignment and navigation across the reticle is done by an imaging system, which comprises an objective lens 113, a tube-lens 111 and a CCD camera 110.

Images from the CCD camera 110 of alignment marks on reticle 107 at the focus of objective lens 113 are transferred 119 and processed by the central PC 116 and exact coordinates of all points are registered by stage control 118, for the full mapping process.

Reticle navigation system gets the light for imaging from a light source 115, which is imaged to the objective lens 113 focal point by a condenser lens 114.

Figure 2:
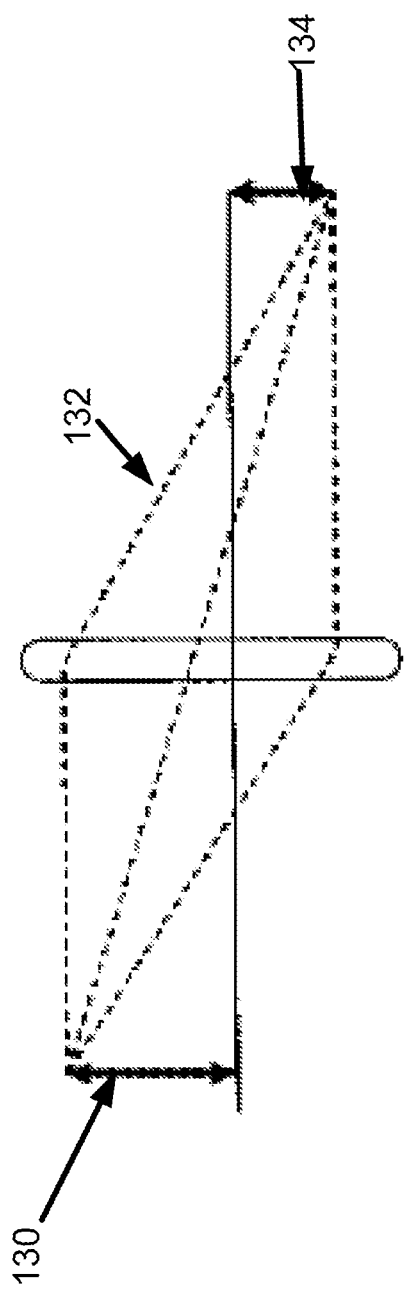
FIG. 2 is a schematic diagram of the path of light in imaging optics.
Figure 3:
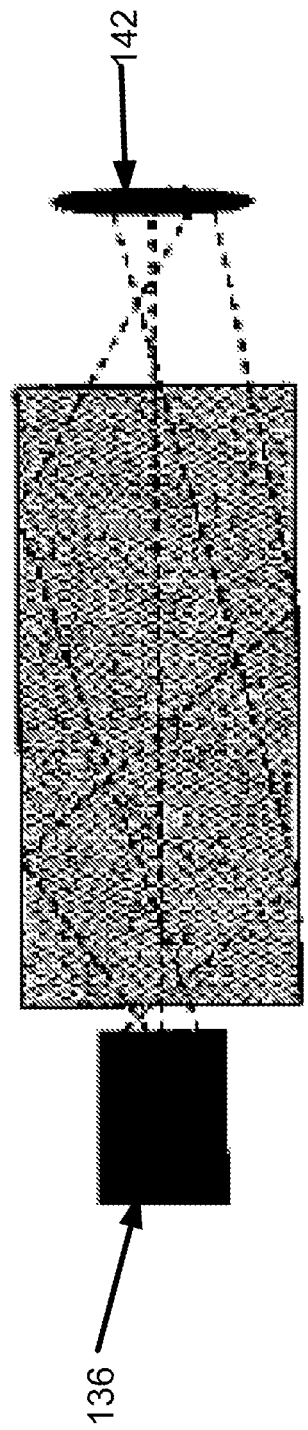
FIG. 3 is a schematic diagram of the path of light in non-imaging optics.

The measurement and mapping system is a non-imaging tool. In general, a non-imaging tool is a tool in which a one to one correspondence between an object and an image does not exist. Since there is not a one to one correspondence between the object and the image, points of a source collected at a target plane are generally not distinguishable and an image is not formed at a detector. While, generally, in a non-imaging tool, an image is not formed at the detector, unintentional correspondence between an object and an image at the target plane may occur and/or a poor image could be formed. However, in the measurement and mapping system any such image would not be detected by the non-imaging detector or used to generate the CD distribution. FIG. 2 is a schematic diagram of the path of light in imaging optics. In contrast, FIG. 3 is a schematic diagram of the path of light in non-imaging optics.

Referring the FIG. 2, in general, imaging optics technology requires a one to one correspondence between an object 130 and an image at the target 134. Due to the one to one correspondence, rays 132 emanating from each point in the object converge to one associated point at the image plane 134 such that the object is "mapped" at the image (target) plane 134. In imaging optics systems, points are distinguishable in both their coordinates and their intensity level. In order to perform a transmission measurement using imaging optics, a group of points within the field of view needs to be averaged to obtain its grey-level value. Typical dynamic range is 256 ($2^8$) grey-levels, which together with typical CCD noise results in accuracy levels of >0.5%. For patterned masks, and in particular for contact-holes mask, CCD dynamic range and intensity levels are so low in transmission mode, that accuracy can deteriorate to unacceptable levels. In imaging systems, the field of view is generally limited to less then 100 u at DUV, and averaging is limited to a few hundreds of pixels where there is no absorber (clear area). Therefore, computation time can be long. Imaging optics require very high, full field illumination uniformity, and even the best diffraction limited design cannot fully compensate for source non uniformities and optical fabrication errors. This by itself adds more than 0.5% to the error budget. Finally, even high quality state of the art imaging systems can not measure transmission with accuracy better than approximately 1%.

Referring the FIG. 2, in general, in non-imaging optics technology all points of a source 136 collected at a target plane 142 are not distinguishable and no image is formed at the target plane 142. The use of non-imaging optics eliminates the need for averaging of pixels since a CCD is not used. Instead, as described above, wide band DUV irradiance from the source 136 to the target 142 is directed through the photomask onto a fast wide band detector. By fast averaging of strong signals and a sensitive and stable detection system, the dynamic range of the measurement is more than three orders of magnitude larger than in the example of imaging optics described above. Transmitted energy averaging is done on a large field, typically 0.5 mm, and local non uniformities of the source and other optical component aberrations in the optical path are irrelevant. As such, accuracy levels are believed to reach 0.1% even on a densely patterned mask. Although non imaging optics compromise image fidelity by allowing all scrambled angles of illumination to pass through the target and to be detected, with a proper non imaging optical design there is a large gain in energy transmission which leads to dramatic improvements in SNR and measurement time. In some examples, due to the large spot size which averages transmission and short measurement time, the whole measurement process throughput is high. In some embodiments, a full mask can be mapped in less then one hour.

Figure 4:
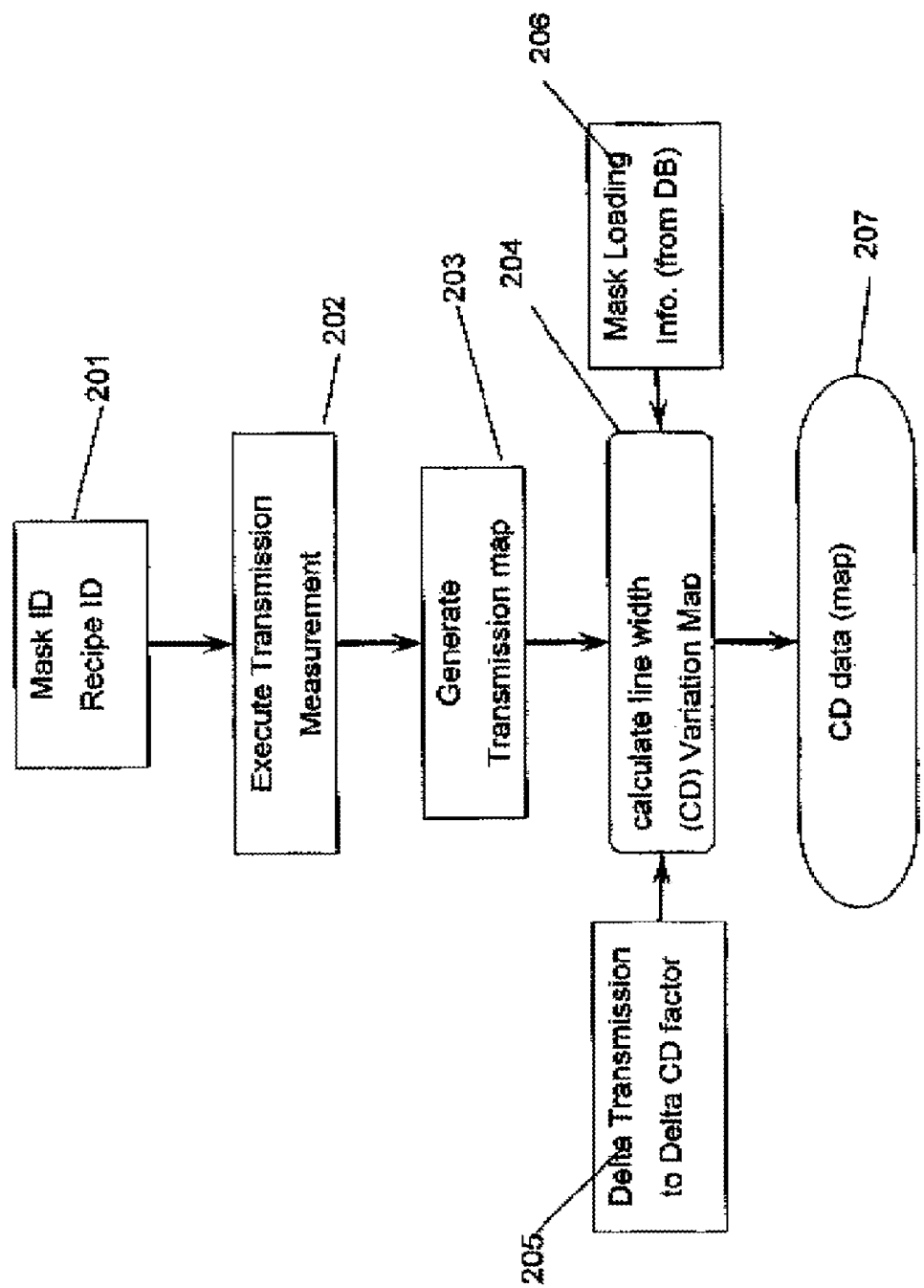
FIG. 4 illustrates CD distribution measurement process flow-chart.

FIG. 4 illustrates CD distribution measurement process flow-chart in accordance with a preferred embodiment of the present invention.

The photomask ID 201 and the selected recipe are loaded on the tool and a full sized reticle transmission measurement is followed 202. Measurement results are saved in a data base, and a full reticle transmission map is generated 203. By applying the linear slope factor of CD versus Transmission plot 205, which is determined independently, the next algorithm generates the Delta CD map out of the transmission map 204. Two types of analysis can follow: If pattern on the photomask has repeatable features, periodic or semi-periodic, Delta transmission is converted to Delta CD map according to a predetermined map of periodical features, and a final CD distribution map is generated 207.

If, on the other hand, periodicity does not exist at a large enough number of measurement points, then the user has the option of applying a photomask pattern loading correction 206 which takes into account changes in transmission due to different patterns. Since the full photomask design is known with exact coordinates and geometry, the calculated different pattern loading, are inserted into data base, and for each measurement point, a correction factor is introduced based on mask design data base. Therefore, a final Delta CD map can be generated accordingly 207.

FIG. 5 illustrates a typical linear regression plot of Delta CD versus controlled transmission descending values, on real patterned photomask, with periodic identical features of dense lines and spaces.

Controlled transmission was achieved by applying shading elements inside the reticle bulk above the pattern, where each periodic cell had a 0.25% more shading then its next neighbor.

Lines and spaces in this example are with CD of 65 nm on wafer level (260 nm on mask level). CD was measured by a standard optical imaging (aerial imaging) tool "AIMS" (Carl Zeiss SMT inc.).

A linear relation between CD and DUV transmission is clearly seen, with correlation factor of nearly 1 (R squared).

Figure 6:
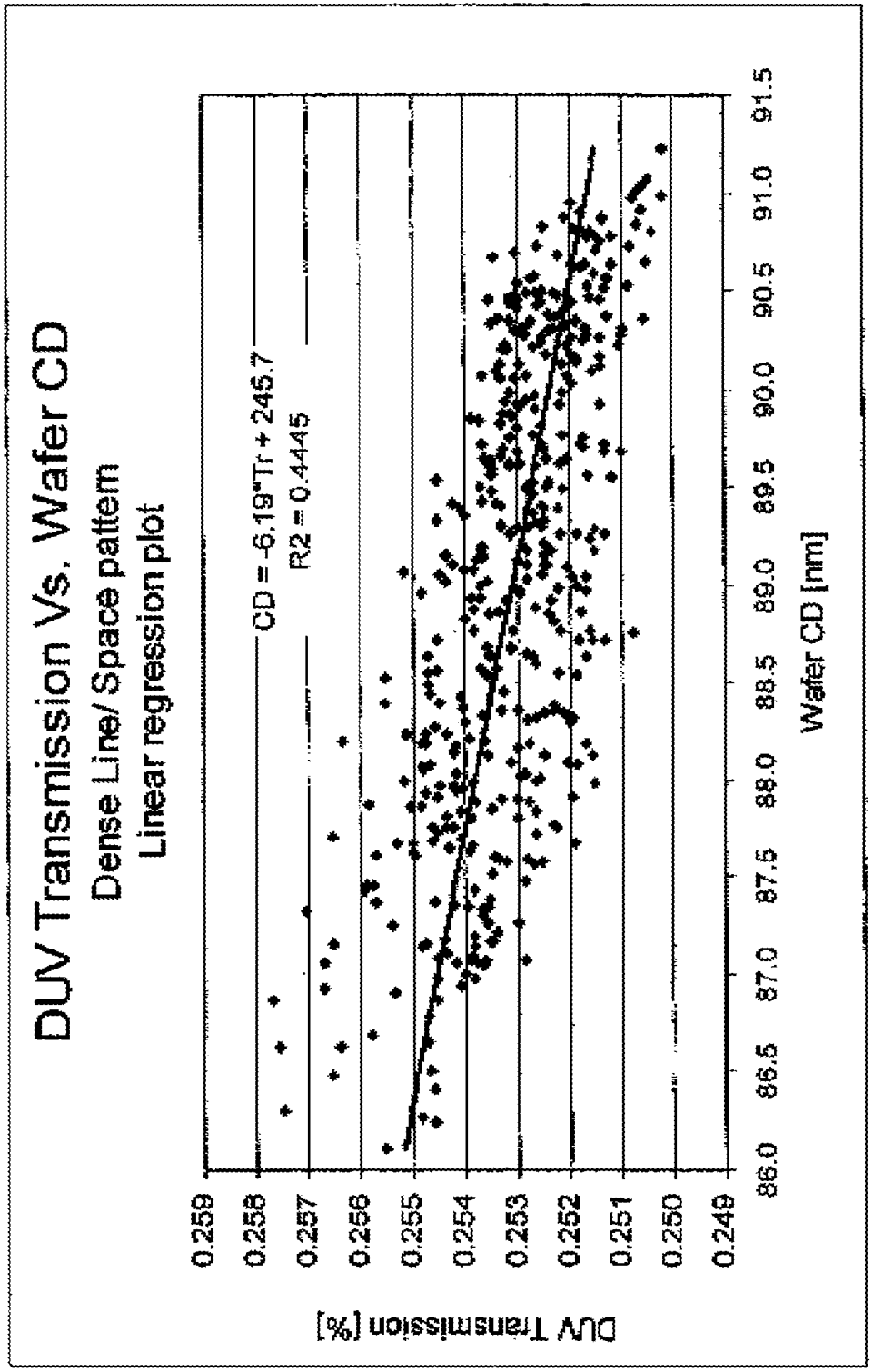
FIG. 6 illustrates patterned photomask linear regression plot of DUV transmission versus Delta CD on real Silicon wafer, measured by CD SEM (scanning electron microscope).

FIG. 6 illustrates patterned mask linear regression plot of DUV transmission versus Delta CD on real Silicon wafer, measured by CD SEM (scanning electron microscope).

Wafer CD measurements includes measurement errors, as well as all lithography printing process variations. Even when all these additional process and measurement errors are included, the linear relation still holds, and the end user can verify his process and compare with the data received from transmission measurements.

Following the calibration steps with CD SEM or optical CD measurement, the user can rely on transmission measurements, which are free from the lithography process errors, and the data can be transformed directly to reticle (photomask) CD variations only.

In some embodiments, the determination of the critical dimensions (CD) distribution on a photomask by measurement of DUV transmission across the photomask can be used to verify the effectiveness of a photomask correction process. More particularly, prior to performing the transmission measurements and determining the CD distribution, a correction process can modify the critical dimension of one or more features on the photomask. The effectiveness of this correction process can be verified using the determined CD distribution.

Figure 7:
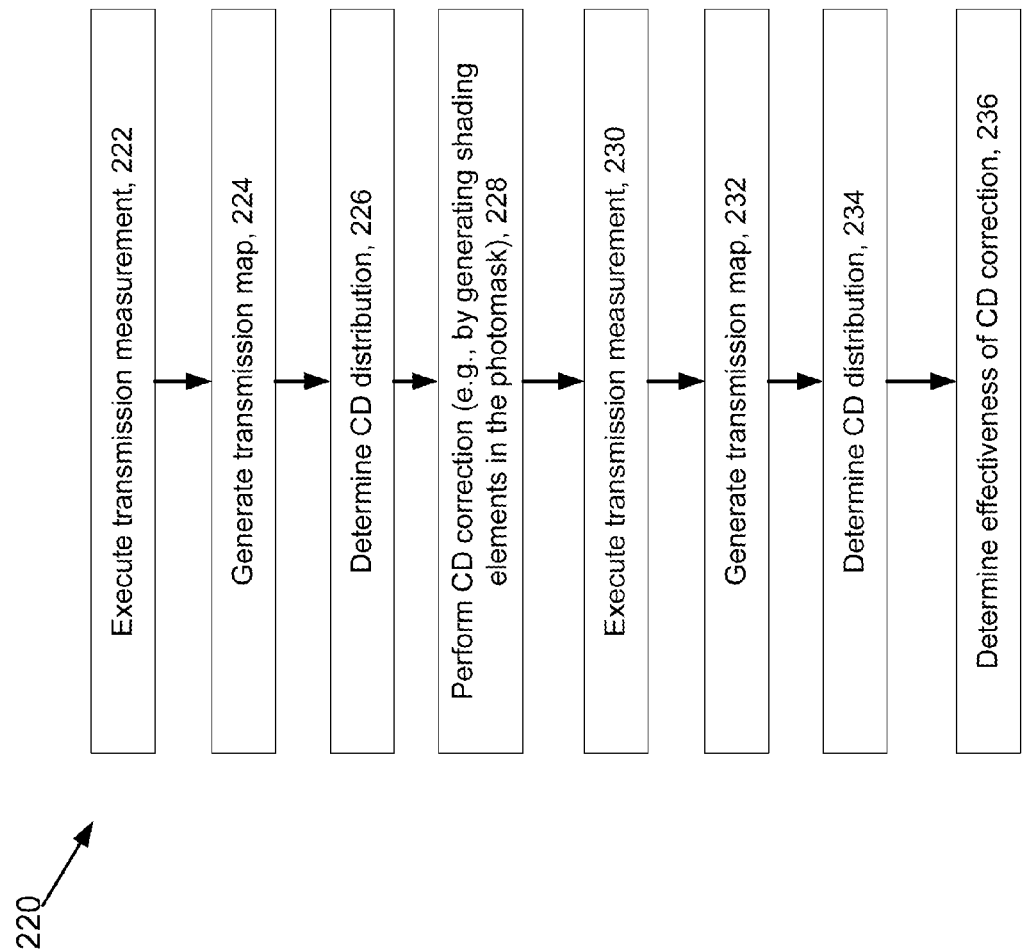
FIG. 7 illustrates a CD correction validation process flow-chart.

FIG. 7 shows a flowchart of a process 220 for performing a correction process to correct the CD in a photomask and verifying the CD correction by generating a CD distribution based on DUV transmission across the photomask. Prior to the CD correction, process 220 includes executing a transmission measurement 222 and generating a transmission map 224. The transmission map is used to determine CD distribution using one or more of the methods disclosed herein 226. This initial CD distribution provides information about the CD distribution across the photomask prior to correction.

Process 200 also includes performing CD correction on the photomask 228. In some examples, CD correction can be used to repair a damaged photomask-mask with undesired defect (e.g., due to a scratch, hole, lack of material, excessive material or other unintentional reason) in the chrome layer by writing a diffractive optical element (DOE) or a shading element (SE) in front of the undesired defect. The diffractive element effectively blocks, diffracts or diverts light irradiation as the mask is irradiated in the IC manufacturing process. This way the irradiated light in the IC manufacturing process is redistributed to overcome the defect, so that the desired pattern will be printed correctly onto the wafer. The DOE/SE structure design is aimed at casting a shadow or change the scattering properties of the substrate adjacent a void or pinhole scratches, or any other defect in Chrome layer of the photo masks. The DOE/SE is generated using laser energy to change the scattering properties of the material, such as changing the index of refraction, or creating some level of absorption, or producing micro-cracks in the material, etc. The DOE/SE can be designed and generated using methods and systems, such as those described in commonly owned patent application Ser. No. 10/504,866, entitled "METHOD AND SYSTEM FOR REPAIRING DEFECTED PHOTOMASKS" and filed Dec. 12, 2002, the contents of which are incorporated herein by reference.

After performing the CD correction on the photomask, process 200 includes executing a transmission measurement 230 and generating a transmission map 232. The transmission map is used to determine CD distribution of the photomask after CD correction using one or more of the methods disclosed herein 234. The CD distribution of the photomask after CD correction can be used to determine the effectiveness of the CD correction 236.

In some examples, the CD distribution measured after CD correction can be compared to the CD distribution measured prior to CD correction. For example, a difference map of the CD distribution prior to the CD correction and the CD distribution after the CD correction can be generated to show the effect of the CD correction.

Other embodiments are within the scope of the following claims.

What is claimed is:

1. A method comprising:
   illuminating a photomask using deep ultra-violet (DUV) light; and
   determining a critical dimension (CD) distribution on the photomask by measuring DUV transmission across the photomask;
   wherein measuring the DUV transmission comprises performing transmission measurements at a plurality of locations on the photomask using non-imaging optics to direct DUV light from the photomask to a detector without forming an image at a plane near the detector.

2. The method of claim 1, wherein measuring the DUV transmission comprises performing transmission measurements at a plurality of locations on a photomask using a non-imaging tool comprising the non-imaging optics and the detector to generate transmission information.

3. The method of claim 2, wherein the non-imaging tool comprises a tool in which a one to one correspondence between an object and an image does not exist.

4. The method of claim 2, wherein the non-imaging tool comprises a tool configured such that points of a source collected at a target plane are not distinguishable.

5. The method of claim 1, wherein the critical dimension distribution provides information about line-width size distribution of lines patterned on a photomask.

6. The method of claim 1, wherein measuring the DUV transmission comprises focusing a radiation beam on a front side of the photomask.

7. The method of claim 6, wherein focusing the radiation beam on the front side of the photomask comprises by irradiating the photomask through a back side of the photomask.

8. The method of claim 1, further comprising generating a transmission map based on the measured DUV transmission.

9. The method of claim 8, wherein determining the CD distribution comprises generating a CD distribution map based on the transmission map.

10. The method of claim 1, wherein determining the CD distribution comprises applying a correction factor, the correction factor being based on a predetermined linear ratio between CD variations and transmission variations.

11. The method of claim 1, wherein determining a CD distribution comprises determining transmission variations based on the measured DUV transmission and transforming the transmission variations into a CD distribution map according to a ratio.

12. The method of claim 11, wherein the ratio is a linear ratio.

13. The method of claim 11, further comprising, prior to performing transmission measurements, determining the ratio by calculating a ratio between CD variations and transmission variations.

14. The method of claim 1, wherein a measurement time for each of the transmission measurements is less than one second.

15. The method of claim 1, wherein a pattern on the photomask comprises a non-periodic pattern.

16. The method of claim 15, further comprising calculating expected transmission values for a plurality of measurement positions on the photomask based on the non-periodic pattern on the photomask.

17. The method of claim 16, further comprising calculating a correction factor for each of the plurality of measurement positions on the photomask based on the expected transmission values.

18. The method of claim 17, wherein calculating information indicative of CD uniformity comprises calculating information indicative of CD uniformity based on the transmission measurement and the calculated correction factor.

19. The method of claim 1, wherein measuring the DUV transmission comprises performing multiple transmission measurements at each of a plurality of locations on the photomask and averaging the multiple measurements at each of the plurality of locations to generate the transmission information.

20. The method of claim 19, wherein averaging the multiple measurements generates transmission information having an accuracy level of less than about 0.1% transmission level.

21. The method of claim 1, further comprising prior to performing the transmission measurements and determining the CD distribution, performing a correction process to modify the critical dimension of one or more features on the photomask.

22. The method of claim 21, wherein the correction process comprises applying shading elements.

23. The method of claim 22, wherein applying shading elements comprises applying shading elements inside the photomask.

24. The method of claim 21, further comprising determining an effectiveness of the correction process based on the determined CD distribution.

25. The method of claim 1, wherein performing transmission measurements at a plurality of locations on the photomask comprises measuring a transmission distribution across the photomask, and determining the critical dimension distribution further comprises
   determining the critical dimension distribution across the photomask based on the measured transmission distribution.

26. A system comprising:
   a detection device configured to measure deep-UV (DUV) transmission across a photomask;
   non-imaging optics to direct DUV light from the photomask to the detection device without forming an image at a plane near the detection device; and
   a computing system configured to determine a critical dimension distribution based on the measured DUV transmission across the photomask.

27. The system of claim 26, wherein the system comprises a non-imaging system that comprises the non-imaging optics.

28. The system of claim 26, wherein the non-imaging system comprises a system in which a one to one correspondence between an object and an image does not exist.

29. The system of claim 26, wherein the non-imaging system comprises a system configured such that points of a source collected at a target plane are not distinguishable.

30. The system of claim 26, further comprising an illumination source configured to generate a DUV radiation beam and direct the deep-UV radiation beam onto the photomask.

31. The system of claim 30, wherein the illumination source is configured to generate a spot size of from about 0.2 mm to about 5.5 mm in diameter.

32. The system of claim 30, wherein the illumination source comprises a wide-band illumination source.

33. The system of claim 26, wherein the detection device comprises a fast photodiode.

34. The system of claim 26, further comprising an imaging system configured to align the photomask.

35. The system of claim 34, wherein the critical dimension distribution comprises a critical dimension variation map.

36. The system of claim 26, wherein the critical dimension distribution comprises a synthetic variation map.

* * * * *

UNITED STATES PATENT AND TRADEMARK OFFICE
CERTIFICATE OF CORRECTION

PATENT NO. : 8,421,026 B2
APPLICATION NO. : 12/811591
DATED : April 16, 2013
INVENTOR(S) : Guy Ben-Zvi et al.

Page 1 of 1

It is certified that error appears in the above-identified patent and that said Letters Patent is hereby corrected as shown below:

On the Title Page

Column 1, (75) Inventors, line 2, Post Office address of second Inventor, delete "Kanniel (IL)" and insert -- Karmiel (IL) --

Signed and Sealed this
Sixteenth Day of July, 2013

Teresa Stanek Rea
*Acting Director of the United States Patent and Trademark Office*